(12) United States Patent
Hubbard

(10) Patent No.: US 10,854,525 B2
(45) Date of Patent: Dec. 1, 2020

(54) METHOD OF CURING THERMOPLASTICS WITH MICROWAVE ENERGY

(71) Applicant: APPLIED MATERIALS, INC., Santa Clara, CA (US)

(72) Inventor: Robert L. Hubbard, Eugene, OR (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/246,773

(22) Filed: Jan. 14, 2019

(65) Prior Publication Data

US 2019/0148252 A1 May 16, 2019

Related U.S. Application Data

(62) Division of application No. 13/986,012, filed on Mar. 22, 2013, now Pat. No. 10,224,258.

(51) Int. Cl.
*H01L 23/29* (2006.01)
*H01L 23/532* (2006.01)
*H01L 23/00* (2006.01)

(52) U.S. Cl.
CPC ............ *H01L 23/293* (2013.01); *H01L 23/29* (2013.01); *H01L 23/5329* (2013.01); *H01L 23/562* (2013.01); *H01L 2924/0002* (2013.01)

(58) Field of Classification Search
CPC ..... H01L 23/293; H01L 23/29; H01L 23/552; H01L 23/5329; H01L 23/562
See application file for complete search history.

(56) References Cited

U.S. PATENT DOCUMENTS 4,590,258 A * 5/1986 Linde ................. C08G 73/1071
528/189
5,108,819 A * 4/1992 Heller .................... A61B 5/076
428/195.1

(Continued)

FOREIGN PATENT DOCUMENTS

JP 2005-105079 A 4/2005
JP 2006-028271 A 2/2006

OTHER PUBLICATIONS

Hiroshi Matsutani, et al., "Low Temperature Curing of Polyimide Precursors by Variable Frequency Microwave", Journal of Photopolymo(R Science and Technology, vol. 18, No. 2, (2005) pp. 327-332.

(Continued)

*Primary Examiner* — David A Zarneke
(74) *Attorney, Agent, or Firm* — Moser Taboada; Alan Taboada

(57) ABSTRACT

A method for densifying thermoplastics, particularly polyimides, for use in conjunction with electronic circuits while producing improved physical properties and a high degree of crystallinity, involves variable frequency microwave (VFM) processing at temperatures typically 100° C. below the glass transition temperature or lower, for times of about 50 to 100 minutes. It is particularly applicable to polymers based on BPDA-PPD, but may also be generally applied to other intentionally designed polyimide structures with the same features. The invention enables the creation of layered structures involving integrated circuits with small feature sizes and overcoatings of polymers with high $T_g$ and other desirable properties.

8 Claims, 7 Drawing Sheets

(56) References Cited

U.S. PATENT DOCUMENTS

| | | | | |
|---|---|---|---|---|
| 5,144,407 | A * | 9/1992 | Wojnarowski | H01L 23/293 257/705 |
| 5,279,739 | A | 1/1994 | Pemawansa | |
| 5,374,503 | A | 9/1994 | Sachdev et al. | |
| 5,477,360 | A | 12/1995 | Sunohara et al. | |
| 5,644,837 | A | 7/1997 | Fathi et al. | |
| 5,738,915 | A | 4/1998 | Fathi et al. | |
| 5,745,984 | A * | 5/1998 | Cole, Jr. | H01L 23/293 174/259 |
| 5,814,894 | A * | 9/1998 | Igarashi | H01L 21/563 257/778 |
| 5,932,345 | A * | 8/1999 | Furutani | C08G 73/1042 428/364 |
| 5,948,317 | A * | 9/1999 | Sato | C09K 19/04 252/299.61 |
| 5,998,876 | A * | 12/1999 | Carter | H01L 23/293 257/778 |
| 6,143,423 | A * | 11/2000 | Shiobara | C08L 63/00 428/620 |
| 6,147,374 | A * | 11/2000 | Tanaka | C08L 79/08 257/295 |
| 6,166,433 | A * | 12/2000 | Takashima | H01L 21/563 257/702 |
| 6,275,277 | B1 | 8/2001 | Walker et al. | |
| 6,624,501 | B2 * | 9/2003 | Shioga | H01L 23/49822 257/534 |
| 6,653,701 | B1 * | 11/2003 | Yamazaki | H01G 9/2031 136/248 |
| 6,770,547 | B1 * | 8/2004 | Inoue | H01L 21/563 438/496 |
| 7,250,121 | B2 * | 7/2007 | Yamamoto | C08G 73/1039 252/582 |
| 7,335,608 | B2 * | 2/2008 | Tanikella | H01L 21/4857 438/780 |
| 8,105,697 | B2 * | 1/2012 | Cho | B82Y 10/00 428/624 |
| 8,431,433 | B2 * | 4/2013 | Shukla | H01L 51/0027 438/99 |
| 8,450,726 | B2 * | 5/2013 | Shukla | H01L 51/0053 257/40 |
| 8,710,682 | B2 * | 4/2014 | Dershem | H01L 21/02282 257/632 |
| 8,759,989 | B2 * | 6/2014 | Matsumura | C08G 73/1039 257/791 |
| 2005/0152773 | A1 * | 7/2005 | Sumita | C08G 59/5033 414/664 |
| 2006/0214153 | A1 * | 9/2006 | Ikezawa | H01L 21/563 257/40 |
| 2006/0216520 | A1 * | 9/2006 | Osada | C08G 59/4042 428/413 |
| 2006/0284158 | A1 | 12/2006 | Lung et al. | |
| 2007/0158869 | A1 | 7/2007 | Yanagida et al. | |
| 2007/0284034 | A1 | 12/2007 | Fathi et al. | |
| 2008/0083995 | A1 * | 4/2008 | Osada | C08G 59/4042 257/793 |
| 2008/0090176 | A1 * | 4/2008 | Kusunoki | C08G 59/3218 430/280.1 |
| 2008/0277652 | A1 * | 11/2008 | Mochizuki | H01L 31/20 257/40 |
| 2009/0091012 | A1 * | 4/2009 | Tateoka | C08G 73/106 257/676 |
| 2010/0152338 | A1 * | 6/2010 | Yamamoto | C07F 7/0814 524/84 |
| 2010/0209384 | A1 | 8/2010 | Cherif-Cheikh et al. | |
| 2011/0122590 | A1 * | 5/2011 | Wilson | C08G 59/027 361/760 |
| 2012/0041156 | A1 | 2/2012 | Jeong et al. | |
| 2013/0126860 | A1 * | 5/2013 | Fukuda | G03F 7/0045 257/43 |
| 2013/0288120 | A1 * | 10/2013 | Iida | C08G 73/105 429/211 |
| 2013/0299953 | A1 | 11/2013 | Hubbard et al. | |
| 2013/0309621 | A1 | 11/2013 | Huang et al. | |
| 2014/0308530 | A1 * | 10/2014 | Sugano | C08J 5/24 428/460 |
| 2015/0299550 | A1 * | 10/2015 | Kusunoki | B29C 43/02 252/75 |
| 2017/0299965 | A1 * | 10/2017 | Hashimoto | H01L 27/3258 |
| 2019/0031586 | A1 * | 1/2019 | Suh | C07D 303/48 |

OTHER PUBLICATIONS

Hiroski Sato et al., Data Processing Method for the Determination of Accurate Molecular Weight Distribution of Polymers by SEC/MALDI-MA, Analytical Sciences, Sep. 2004, vol. 20. pp. 1259-1294.

* cited by examiner

METHOD OF CURING THERMOPLASTICS WITH MICROWAVE ENERGY

CROSS-REFERENCE TO RELATED APPLICATIONS

This application is a divisional of U.S. provisional patent application Ser. No. 13/986,012, filed Mar. 22, 2013, which are herein incorporated by reference in their entireties.

BACKGROUND OF THE INVENTION

Field of the Invention

The invention pertains to apparatus and methods for densifying thermoplastic polymers, and more particularly to methods for creating dense thermoplastic films with improved crystallinity on selected substrates.

Description of Related Art

Polyimides are attractive materials for the microelectronics industry because of their excellent mechanical, electrical, and chemical properties. The process time for conventional thermal curing typically ranges from 4 to 6 hours; slow temperature ramp rates and extended hold times at various temperatures are needed to allow for slow reaction rates, outgassing of reaction by-products and solvent, and orientation of polymer chains. Reducing the processing time required to cure these polymers would increase throughput and reduce overall production costs.

Polyamic acid based polyimides such as 3, 3', 4, 4'-biphenyltetracarboxylic acid dianhydride (BPDA) with p-phenylenediamine (PPD) are desirable for electronic packaging applications where a low residual stress dielectric is essential. Many of the unique properties of this polymer are attributed to the rigid nature of its backbone and the high degree of orientation that occurs during cure. This orientation is critical to achieving the low coefficient of thermal expansion (CTE), creating a low stress film.

One obvious shortcoming of this type of polymer system is the high cure temperature (typically 350° C.), which precludes its use in many advanced semiconductor systems, where the small feature size and correspondingly reduced diffusion distances severely limit the thermal budget available for the various process steps. For instance, a recent paper reported desirable properties of this polymer system, Table 1, but all of the films reported had been processed at 310-350° C., whether by conventional oven curing, rapid hotplate curing, or microwave curing [K. D. Farnsworth et al., Variable Frequency Microwave Curing of 3,3',4,4'-Biphenyltetracarboxylic acid dianhydride/P-Phenylenediamine (BPDA/PPD), *Intl. Journal of Microcircuits and Electronic Packaging* 23:162-71 (2002)]. Although the VFM cure was significantly faster, cure temperature was unchanged, and cure temperatures in this range are well beyond the allowable maximum temperature for many applications of interest. The difficulty in applying these polymer systems to demanding electronic applications can be seen by the fact that the commercial version of BPDA/PPD has been available for more than thirty years, and yet had very limited use.

TABLE 1

Typical Cured PI 2611 Properties by Prior Art Methods

| Property | Thermal Cure | Hotplate | VFM |
|---|---|---|---|
| Final cure temperature, ° C. | 350 | 350 | 350 |
| Total cure time, s | 18,000 | 3600 | 1200 |
| Residual stress, MPa on [100] Si | 6 | 35.3 | 4.2 |
| CTE, ppm/° C. | 3 | 6.6 | 3.8 |
| Tensile strength, GPa | >0.374 | >0.0841 | >0.361 |
| Dielectric constant at 10 kHz | 3.06 | 3.09 | 3.34 |
| Loss tangent at 10 kHz | 0.0032 | 0.00426 | 0.0033 |
| Birefringence | 0.2249 | — | 0.2237 |
| Degree of cure | 100% | 87-108% | 82-102% |
| Degradation temperature, ° C. | 539 | — | 540 |

Objects and Advantages

Objects of the present invention include the following: providing an improved method for densifying thermoplastic films; providing a method for densifying thermoplastic films on semiconductor substrates; providing a method for coating a semiconductor wafer with a thermoplastic film having improved properties; providing a low-temperature process for making a thermoplastic film with improved crystallinity; and, providing a method for creating a polyimide film with controlled orientation on a selected substrate. These and other objects and advantages of the invention will become apparent from consideration of the following specification, read in conjunction with the drawings.

SUMMARY OF THE INVENTION

According to one aspect of the invention, a method for densifying a thermoplastic film comprises:

depositing the thermoplastic in soluble form onto a selected substrate;

soft baking the film to remove residual solvent; and, curing the film by VFM for 20 to 120 minutes at a temperature no higher than 100° C. below the glass transition temperature, $T_g$, of said thermoplastic.

According to another aspect of the invention, a method for making a microelectronic device comprises:

preparing a semiconductor wafer with an integrated circuit thereon;

depositing a thermoplastic film in soluble form onto the semiconductor wafer;

soft baking the film to remove residual solvent; and, curing the film by VFM for 20 to 120 minutes at a temperature no higher than 100° C. below the glass transition temperature, $T_g$, of the thermoplastic.

According to another aspect of the invention, an electronic device comprises:

a semiconductor having a functional integrated circuit thereon; and, a substantially dense thermoplastic coating thereon, said coating having a $T_g$ in the range of 300-400° C.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore non-limiting embodiments illustrated in the drawing figures, wherein like numerals (if they occur in more than one view) designate the same elements. The features in the drawings are not necessarily drawn to scale.

DETAILED DESCRIPTION OF THE INVENTION

In general terms, the invention provides a method for densifying thermoplastics, particularly polyimides, at sufficiently low temperature to be used in conjunction with electronic circuits while producing improved physical properties and a high degree of crystallinity. It is particularly applicable to polymers based on BPDA-PPD, but it will become apparent in the disclosure that follows that the method may be generally applied to other intentionally designed polyimide structures with the same features.

The polymer BPDA-PPD, 3,3',4,4'-Biphenyltetracarboxylic acid dianhydride/P-Phenylenediamine, is a polyamic acid based polyimide manufactured by HD Microsystems (250 Cheesequake Road, Parlin, N.J. 00859-1241) and sold under the product designation PI 2611. At high temperatures (>200° C.), the material undergoes a conversion from its soluble, polyamic acid form, as received from HD Microsystems, to an insoluble, fully imidized polymer. Many of the unique properties of the polymer are attributed to the rigid nature of its backbone and the high degree of orientation, which occurs during cure.

Figure 1:
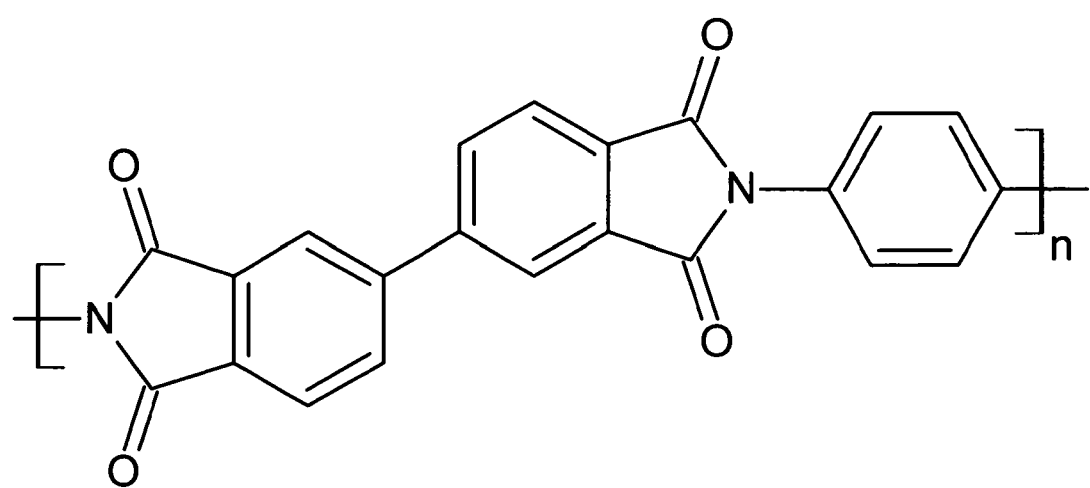
FIG. 1 is a schematic diagram of the structure of BPDA-PPD.

The unusually linear BPDA-PPD, FIG. 1, when cured by conventional oven methods at the recommended 350° C., displays an increase in orientation and crystallinity as evidenced by an increase in modulus, decrease in coefficient of thermal expansion, and infrared (FTIR) peak shifts [J. C. Coburn, M. T. Pottiger, and C. A. Pryde, "Structure Development in Polyimide Films", Mat. Res. Soc. Symp. Proc., Vol. 308, 475-87 (1993)]. These high levels of orientation/crystallization are achieved with cure temperatures between 250° C. and 350° C. with convection heating are seen in Table 2. Curing at temperatures from 350-400° C., which is above the $T_g$ (340° C.), actually decreases the CTE and increases the modulus which results in a sharp increase in residual stress a in the film. This is actually attributed to a loss of in-plane orientation of the rings to the surface. Curing typical non-linear polyimides like BTDA/ODA/MPD, Table 3, above the $T_g$ does not affect the residual stress because they are not aligned to the surface.

TABLE 2

Properties of BPDA-PPD vs. cure temperature (data from Coburn et al. 1993).

| cure temp. (° C.) | Δn | $n_{average}$ | $E_{Young's}$ (GPa) | $\alpha_{in\text{-}plane}$ (μm/m° C.) | σ (MPa) |
|---|---|---|---|---|---|
| BPDA//PPD (Tg = 340) | | | | | |
| 250 | 0.1826 | 1.7641 | 7.1 ± 0.2 | 3 ± 1 | — |
| 300 | 0.1960 | 1.7714 | 7.2 ± 0.2 | 3 ± 1 | 2 ± 1 |
| 350 | 0.1979 | 1.7637 | 7.3 ± 0.2 | 3 ± 1 | 2 ± 1 |
| 400 | 0.2186 | 1.7771 | 8.2 ± 0.2 | 5 ± 1 | 10 ± 1 |

TABLE 3

Properties of BPDA-ODA-MPD vs. cure temperature. BTDA//ODA/MPD (Tg = 320)

| 250 | 0.0122 | 1.6840 | 3.3 ± 0.2 | 45 ± 1 | — |
| 300 | 0.0100 | 1.6859 | 3.2 ± 0.2 | 46 ± 1 | 25 ± 2 |
| 350 | 0.0104 | 1.6861 | 3.3 ± 0.2 | 46 ± 1 | 41 ± 2 |
| 400 | 0.0102 | 1.6867 | 3.3 ± 0.2 | 46 ± 1 | 41 ± 2 |

Applicant began a series of studies to determine if microwave curing could be carried out at substantially lower temperatures, in order to process materials such as BPDA-PPD in a range that would be useful for integrated circuit applications. Experiments were done using a MicroCure™ 2100 VFM (Lambda Technologies, Morrisville, N.C.) with a sweep frequency range of 5.65-7.0 GHz, sweep rate of 0.1 seconds, and 200 W power. As will be shown in the examples that follow, the results were not only surprising, but indeed counter-intuitive from the viewpoint of conventional polymer theories.

Example

Figure 2:
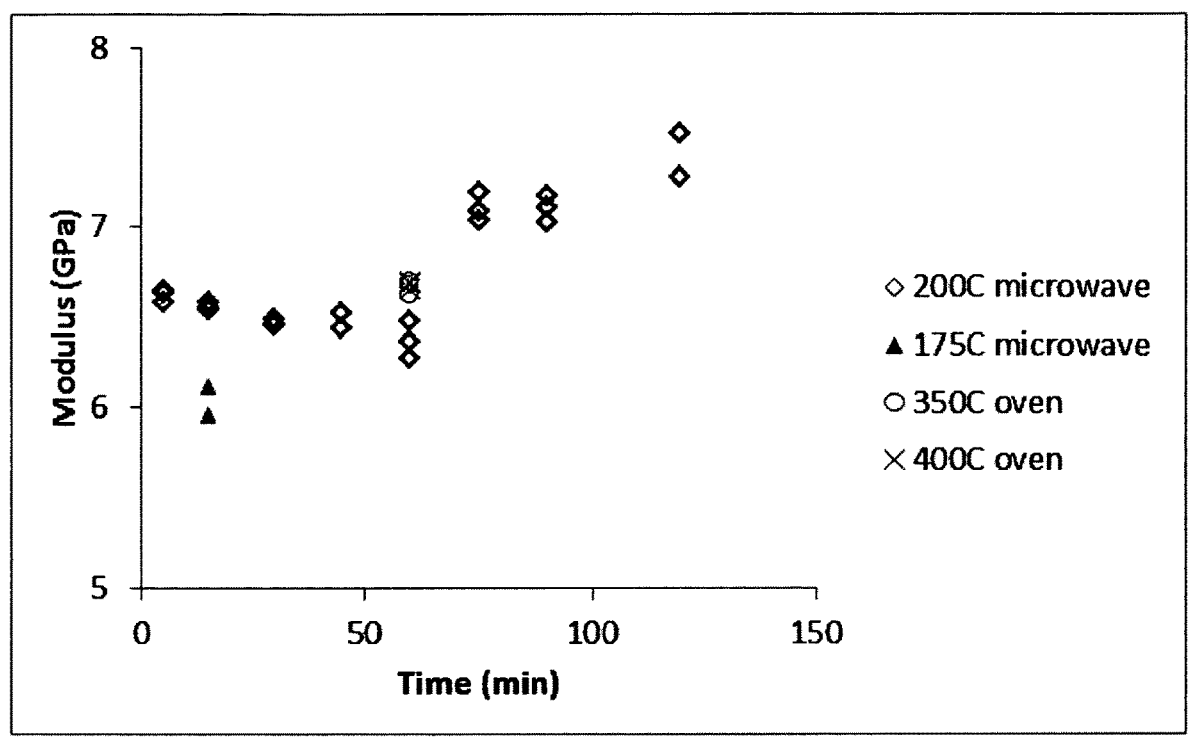
FIG. 2 illustrates the modulus of BPDA-PPD films cured under various conditions.

Films of PI 2611 were VFM cured at 175 and 200° C. for times ranging from 5 to 120 minutes. The resin was spun onto a silicon wafer at 4000 rpm to achieve a 7 μm thick film which was subsequently soft-baked at 130° C. for two minutes to remove residual solvent before the cure. FIG. 2 shows the Young's modulus of these samples compared to oven-cured samples (350 and 400° C.). A surprising observation is that there is a jump in modulus after 60 minutes of curing at 200° C., at which point the modulus is actually higher than that of material cured in a conventional oven. Note: modulus was measured by nanoindentation methods on thickness of 100-200 nm in order to minimize substrate effects.

Example

Figure 3:
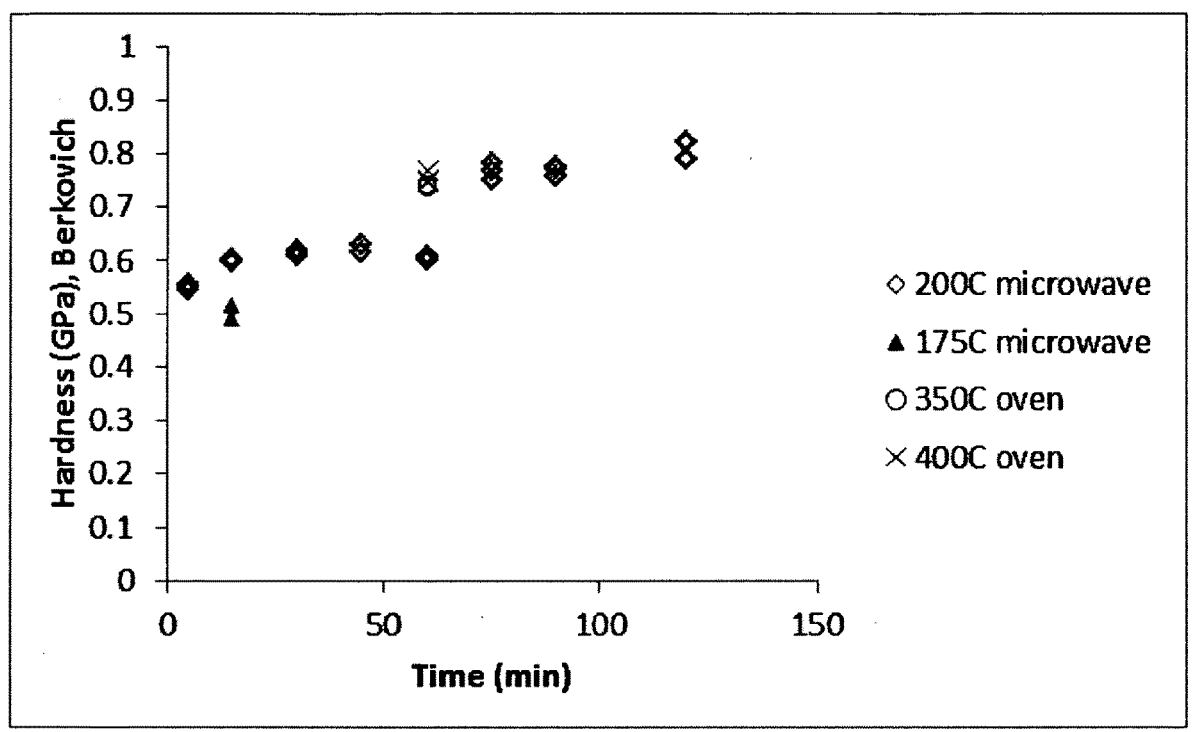
FIG. 3 illustrates the hardness of BPDA-PPD films cured under the same conditions as in FIG. 2.

FIG. 3 presents the hardness of the BPDA-PPD films described in the previous example. Again, one can see a sharp increase at a cure time of about 60 minutes, at which point the hardness is comparable to that produced by a 350° C. oven cure.

Example

Figure 4:
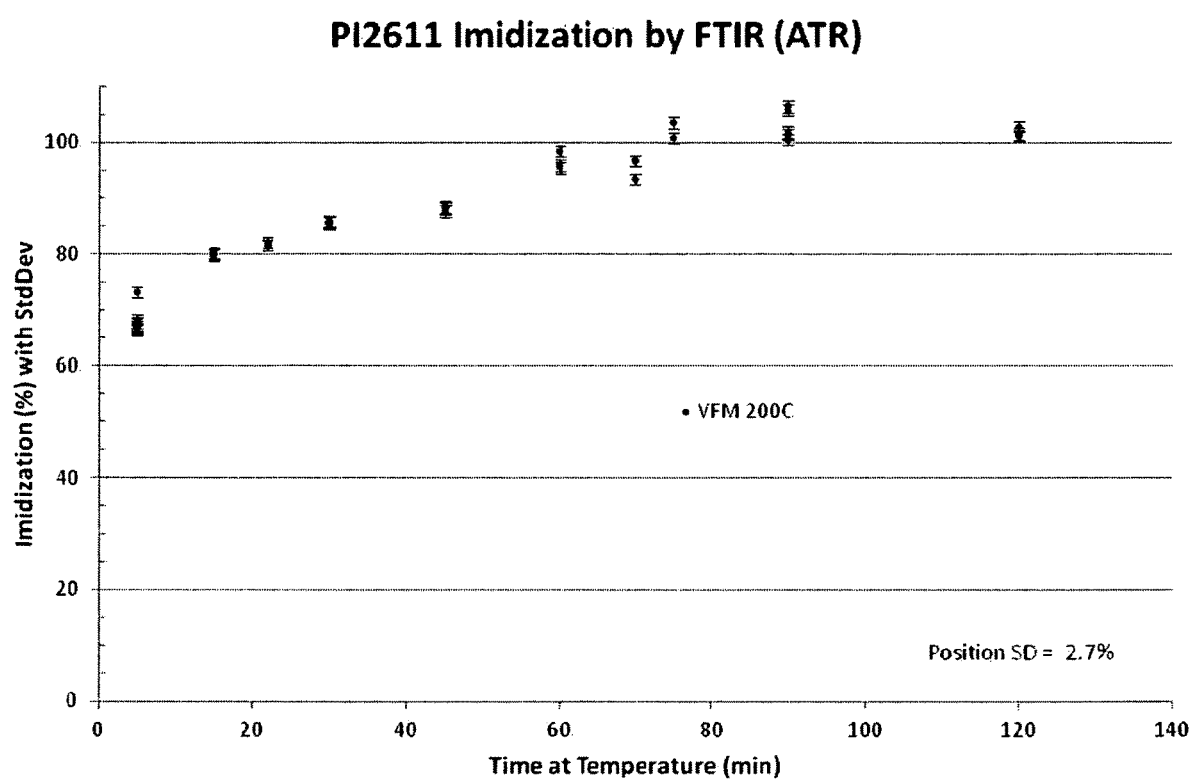
FIG. 4 illustrates the % imidization of BPDA-PPD cured at 200° C. by VFM for various times.

FIG. 4 presents the percent imidization as a function of time at 200° C. by VFM cure, as measured by FTIR. One can see that imidization is about 80% complete after 20 minutes, and essentially complete after 60 minutes, with minor changes from 60 to 120 minutes.

When BPDA-PPD is fully cured ($T_g=350°$ C.) by microwaves (VFM) at only 200° C., the increase in extent of cure from 90-100% and orientation occurs at a sharp transition between 60 and 75 minutes into the process as shown by modulus, FIG. 2, hardness, FIG. 3, and FTIR, FIG. 4. This orientation occurs unexpectedly as a sharp phase transition in time with MW but the modulus does not increase to the higher level seen with convection oven curing while the CTE remains at 3.1 ppm/° C. This represents an even lower residual stress level while never being heated above the $T_g$. As a result, the VFM curing of BPDA/PPD films on silicon wafers shows no additional warpage.

Figure 5:
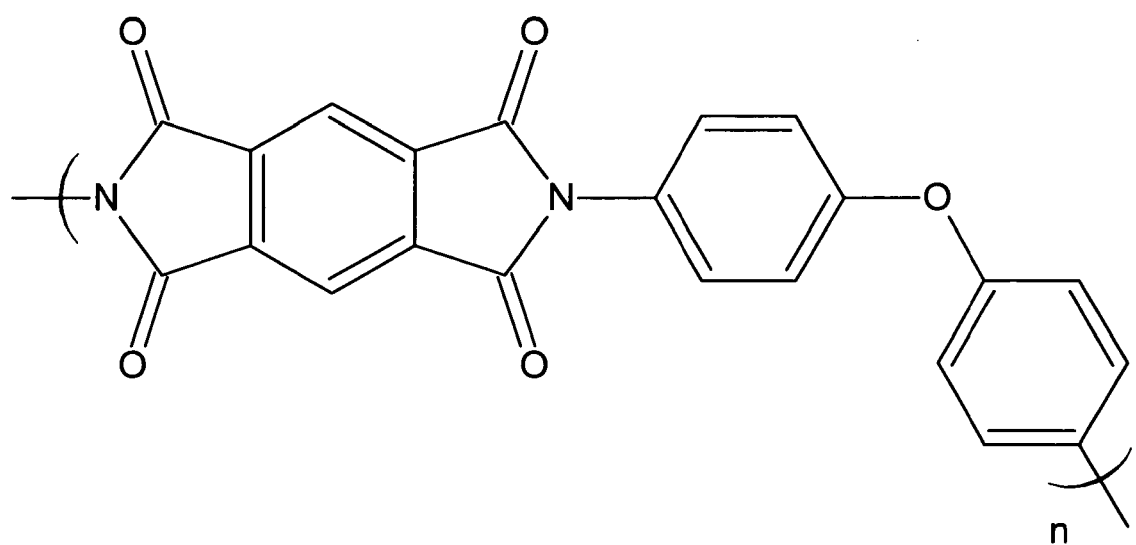
FIG. 5 illustrates the kinked chain characteristic of the polyimide PMDA-ODA.

This high orientation represents a tighter alignment of the polymer chains which is analogous to the highly oriented "rod-like" packing of liquid crystal phases. The electronic nature of this particular thermoplastic structure results from unusually well aligned $sp^2$ orbitals in the aromatic rings and the heterocyclic imide rings along this very linear and rigid structure as shown in FIG. 1. The more common structure of commercially available polyimides, by contrast, is more kinked and flexible as shown in the structure of the common polyimide in Kapton® film, PMDA-ODA, FIG. 5.

The morphologically isotropic PMDA-ODA has an out-of-plane CTE that is only 1.2 times the in-plane CTE whereas an oriented BPDA-PPD is anisotropic with a ratio 25 times higher in-plane. This anisotropic and low CTE closely matches that of silicon (3 ppm/° C.) which allows polymer films coated on silicon wafers to have practically no induced stress after cooling. This is very important to the electronics industry that is increasing the use of stacked thin silicon wafers coated with polyimide dielectric films to provide very high density functionality. The current mismatch of CTE between polymer dielectric films (~60 ppm/° C.) and silicon wafers typically creates 300-800 μm of warpage in 300 mm diameter wafers. This has been an intractable problem because the conventional oven cure temperatures of 350-400° C. cure of BPDA-PPD is far beyond the practical limits of wafer processing for an electronics industry seeking cure temperatures below 250° C. compatible with advanced devices and packaging structures. For example, some advanced memory devices such as polymer or ceramic RAM devices are made inoperable at temperatures much above 250° C. The capability to create highly oriented low CTE polymide films at a cure temperature of only 200° C. with microwaves is a significant technical breakthrough.

Polyimide films have been the organic dielectric of choice for decades in the microelectronic industry because of the materials' high thermal, chemical, and mechanical stability to temperatures above 300° C. Recent progress in electronic device technologies has often created a sensitivity to high temperature processes above 250°. This limitation has forced the industry to search for other chemical classes such as polybenzoxazoles and epoxies that have cure temperatures below 250° C. In all cases, these substitutes for polyimides have compromised stability and dielectric properties or reduced manufacturing robustness. Polyimides incompletely cured by conventional ovens at temperatures below 300° C. have unacceptable chemical and dielectric properties for microelectronic devices.

The capability to create highly oriented, low CTE polyimide films at temperatures as low as 200° C. allows the inclusion of a robust polyimide film cure in most of the packaging process flows which are predominately at or below 250° C. to avoid the decomposition of commonly used epoxy adhesives in die attach, die encapsulation, molding, die underfill, and die stacking applications.

In addition, the difference between a low microwave cure temperature below $T_g$ and the highest temperature seen by any of the other process steps used in the packaging or assembly is now 50° C. or less. This low temperature range excursion nearly eliminates the strong effects of time and temperature on modulus and CTE found with conventional oven curing as described by M. T. Pottiger and J. C. Coburn, "Modeling Stresses in Polyimide Films", Mat. Res. Soc. Symp. Proc., Vol 308, 527-534 (1993).

With the uniform microwave excitation of the critical reactive dipoles throughout the bulk of the material, the cure reaction (imidization/cyclization) of polyimide chains becomes highly efficient while maintaining much lower temperature (200° C.) in bulk. Low temperature curing of polymers has been demonstrated in various systems. As the reaction approaches completion (nearly 90% as shown in FIG. 4), the rigidity of the chains becomes higher and the chains become less mobile. The continued effect of microwave energy in rotating dipoles (primarily carbonyls at this point) assists the orientation/crystalization of these rigid rods into lower energy stacking sites. An analogy can be seen in the synchronous crystallization (freezing) point of small water molecules in the very last degree before 0° C. This synchrony is not seen with the standard convection heating of polymers because that process involves the random collision of chains by collisions with others which disrupts order almost as much as enhances it, thus requiring higher temperatures.

Applicants have shown that microwave induced orientation at surprisingly low temperatures is possible with the linear structure of BTDA-PPD. Based on this observation Applicants expect that this phenomenon can be extended to other intentionally designed polyimide structures with the same features.

Example

Figure 6:
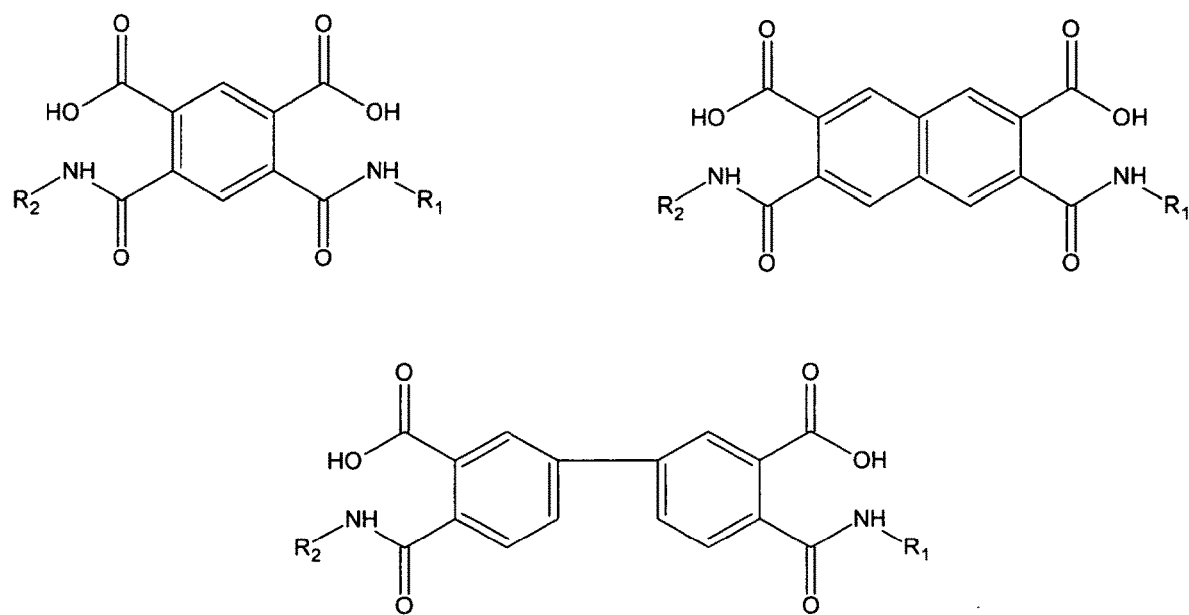
FIG. 6 illustrates some alternative classes of molecules that can provide a di-functional polyamic acid section for a linear polyimide.
Figure 7:
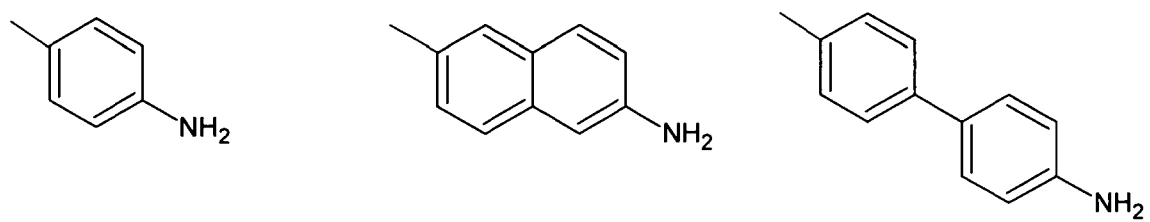
FIG. 7 illustrates some alternative classes of molecules that can provide di-functional amines for a polyimide.

The design of other polymers to exploit the inventive process may combine a di-functional polyamic acid section as suggested by the general classes of FIG. 6 and di-functional amines with R1 and R2 as suggested in FIG. 7. There are many other possibilities that would produce, when cured, a linear, conjugated, and rigid polyimide films with high orientation probability.

It has also been shown [Y. Kuramoto, *Chemical Oscillations, Waves, and Turbulence*. Springer, Berlin (1984)] that sudden phase transitions in chemistry and biology can occur with interactions between molecules at a critical level of distribution. The microwave induced interactions of polarizable polymer chains that are moving at reduced rates near the end of cure, could become more effectively synchronized and highly oriented if the distribution of the lengths of these chains was narrower.

Example

Since the observed orientation or crystallization of BTDA-PPD appears to be sharply synchronous in the manner of a phase transition (see FIGS. 2-4) it should be possible to induce high levels of orientation in other polyimides and other thermoplastics in MW radiation by reducing the chain length distribution in the starting materials. Reducing the polydispersity index (PDI) of a thermoplastic can be done by either using separation techniques such as size exclusion chromatography or by limiting the initial formation of the thermoplastic endcap reaction in the formation of starting materials.

By these methods it should be possible to enhance the mechanical properties of a much wider selection of polyimides as well as other thermoplastics such as polyolefins, polyvinyls, polycarbonates, and acrylonitriles that would benefit from adjustable hardness and CTE. This selective design capability is clearly not possible by the use of standard thermal curing technologies.

Based on the foregoing examples and discussion, it will be appreciated that there is a range of process variables that will yield acceptable results and that optimal parameters may vary from one particular application to another. The skilled artisan can easily optimize the process for a particular system through routine experimentation. For the BPDA-PPD system, Applicants prefer to process in the range of temperatures from 175-225° C. for about 20-120 minutes. For custom-designed polymer formulations, such as those discussed in connection with FIGS. 6 and 7, it will be appreciated that $T_g$ values will likely vary somewhat, but in many cases will lie in the range of about 300-400° C. For these systems, by analogy to BPDA-PPD, Applicants prefer that microwave processing be carried out at a temperature no higher than about 100° C. below Tg for a particular formulation. The upper limit on desirable processing temperature will also be dictated to some degree by the end use. For electronic devices, the industry in general prefers to stay below about 250° C., and in many cases below 200° C., if possible.

It will be clear to the skilled artisan that the invention allows one to fabricate structures that have heretofore been impossible to build. Specifically, one can build up a composite structure in which a functional silicon integrated circuit with an upper temperature limit of 250° C. or less is coated with a dense layer of thermoplastic having a $T_g$ of 350° C. or more. The integrated circuit may comprise features in the range of 100 to 15 nm. By all prior art methods, the processing temperatures needed to densify such polymers would destroy the functionality of the underlying circuit elements.

It will be understood that VFM processing is an inherently flexible method, in which the skilled artisan may select a particular frequency range, sweep rate, etc., based on such variables as the size and shape of the cavity and workpiece, type of substrate, etc. It is well known that sweeping the frequency across some selected bandwidth (typically ±5% or ±10% of a center frequency not only improves uniformity, but prevents arcing and other damaging effects to electronic components in the workpiece. Thus, Applicants prefer to sweep the frequency over a bandwidth of at least ±5% of the center frequency and more preferably ±10%.

The invention claimed is:

1. An electronic device comprising: a semiconductor having a functional integrated circuit with functional circuit features in the range from 100 to 10 nm in width thereon; and, a substantially dense, epoxy-free thermoplastic coating on integrated circuit features, said coating having a $T_g$ in the range of about 350 to 400° C., wherein the coefficient of thermal expansion of the thermoplastic coating sufficiently matches that of the semiconductor to reduce warpage of the coating-semiconductor combination, wherein the thermoplastic coating consists of linear polyamide having a di-functional polyamic acid section and a di-functional amine section, and wherein the polyamide has a backbone consisting essentially of atoms with $sp^2$ orbitals.

2. The device of claim 1, wherein said polyimide comprises BPDA-PPD.

3. The device of claim 1, wherein the semiconductor having a functional integrated circuit is an electronic die adhered to another semiconductor.

4. The device of claim 3, wherein the electronic die is adhered with epoxy.

5. An electronic device comprising: a semiconductor having a functional integrated circuit with functional circuit features in the range from 100 to 10 nm in width thereon; and, a substantially dense thermoplastic coating thereon, said coating having a $T_g$ in the range of 300 to 400° C., wherein the coefficient of thermal expansion of the substantially dense thermoplastic coating sufficiently matches that of the semiconductor to reduce warpage of the coating-semiconductor combination, wherein the thermoplastic coating consists of linear polyamide having a di-functional polyamic acid section and a di-functional amine section, wherein the polyamide has a backbone consisting essentially of atoms with $sp^2$ orbitals, and wherein the thermoplastic coating has a modulus higher than would be obtained with the same soluble polyamide precursor cured with oven curing without assist from microwave curing.

6. The device of claim 5, wherein said polyimide comprises BPDA-PPD.

7. The device of claim 5, wherein the semiconductor having a functional integrated circuit is an electronic die adhered to another semiconductor.

8. The device of claim 7, wherein the electronic die is adhered with epoxy.

* * * * *